US012738902B2

(12) United States Patent
Tahara et al.

(10) Patent No.: US 12,738,902 B2
(45) Date of Patent: Sep. 15, 2026

(54) RADIO FREQUENCY CIRCUIT AND COMMUNICATION DEVICE

(71) Applicant: Murata Manufacturing Co., Ltd., Nagaokakyo (JP)

(72) Inventors: Kenji Tahara, Nagaokakyo (JP); Ryo Wakabayashi, Nagaokakyo (JP); Kae Yamamoto, Nagaokakyo (JP); Yoshiaki Sukemori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 300 days.

(21) Appl. No.: 18/520,587

(22) Filed: Nov. 28, 2023

(65) Prior Publication Data

US 2024/0097626 A1 Mar. 21, 2024

Related U.S. Application Data

(63) Continuation of application No. PCT/JP2022/022226, filed on May 31, 2022.

(30) Foreign Application Priority Data

Jun. 2, 2021 (JP) ................................ 2021-093181

(51) Int. Cl.
*H03F 3/21* (2006.01)
*H03F 3/213* (2006.01)

(52) U.S. Cl.
CPC ............ *H03F 3/211* (2013.01); *H03F 3/213* (2013.01); *H03F 2200/451* (2013.01)

(58) Field of Classification Search
CPC .......... H03F 1/0288; H03F 3/72; H03F 3/211; H03F 1/565; H03F 3/213; H03F 3/195;
(Continued)

(56) References Cited

U.S. PATENT DOCUMENTS 10,425,046 B1 * 9/2019 Ortiz ......................... H03F 1/52
2005/0156671 A1 * 7/2005 Shanjani ................ H03F 1/483
330/295

(Continued)

FOREIGN PATENT DOCUMENTS

CN 108768308 A 11/2018
JP 2006-525751 A 11/2006

(Continued)

OTHER PUBLICATIONS

International Search Report and Written Opinion mailed on Aug. 23, 2022, received for PCT Application PCT/JP2022/022226, filed on May 31, 2022, 12 pages including English Translation.

*Primary Examiner* — Sam K Ahn
(74) *Attorney, Agent, or Firm* — XSENSUS LLP

(57) ABSTRACT

A radio frequency circuit includes carrier and peak amplifiers, a transformer, and an impedance converting circuit. One end of an input coil is connected to an output of the carrier amplifier, one end of an output coil is connected to an output terminal. The impedance converting circuit includes main and auxiliary lines. One end of the main line is connected to an output of the peak amplifier, and the other end of the main line is connected to the other end of the input coil. One end of the auxiliary line is connected to the one end of the main line, and the other end of the auxiliary line is connected to ground. A first direction from the one end to the other end of the main line, and a second direction from the other end to the one end of the auxiliary line are the same.

13 Claims, 9 Drawing Sheets

(58) Field of Classification Search
CPC ............... H03F 3/245; H03F 2200/451; H03F 2203/7209; H03F 2200/537; H03F 2200/111; H04B 1/40
See application file for complete search history.

(56) References Cited

U.S. PATENT DOCUMENTS

| | | | | |
|---|---|---|---|---|
| 2020/0259460 | A1* | 8/2020 | Wang | H03F 1/0288 |
| 2020/0403576 | A1* | 12/2020 | Min | H03F 1/0288 |

FOREIGN PATENT DOCUMENTS

| | | | |
|---|---|---|---|
| JP | 2011-244070 | A | 12/2011 |
| JP | 2013-085179 | A | 5/2013 |
| JP | 2020-038957 | A | 3/2020 |
| WO | 2018/109930 | A1 | 6/2018 |

* cited by examiner

8
COMMUNICATION DEVICE
1
RADIO FREQUENCY CIRCUIT
6
102
84
82
83
81
200
202
20
201
10
11
Carrier
12
Peak
31b
32b
30
301
302
31a
32a
110
120
RF1
RF2
PS
70
15
RF0
101
RFIC
7

CARRIER AMPLIFIER ON
PEAK AMPLIFIER ON
10
Zp = RL/2m2
Zs = RL/2m2
110
11
Vo
20
200
1:m
201
202
RL
Carrier
V1
V2
-Vo
120
12
2i
i
301
Peak
302
Zn = RL/2m2 × 1/4
30
Zs = RL/2m2

CARRIER AMPLIFIER ON
PEAK AMPLIFIER OFF
10
Zp = RL/m2
RL/m2
110
11
Vo
20
200
1:m
RL
Carrier
201
202
120
12
2i
i
301
Peak
302
open
short
30

CARRIER AMPLIFIER ON
PEAK AMPLIFIER ON
500
Zp=RL/2m²
RL/2m²
110
11
Vo
20
200
1:m
RL
201
202
V1
V2
Carrier
-Vo
120
12
530
Peak
λ/4
Zn=RL/2m²
RL/2m²

CARRIER AMPLIFIER ON
PEAK AMPLIFIER OFF
500
Zp=RL/m²
RL/m²
110
11
Vo
20
200
1:m
RL
Carrier
201
202
120
12
530
Peak
λ/4
open
short AMPLIFIER CIRCUIT 10
AMPLIFIER CIRCUIT 500
CARRIER AMPLIFIER CLASS AB/PEAK AMPLIFIER CLASS AB
EFFICIENCY
50
45
40
35
30
25
20
15
10
5
0
20
24
28
32
36
OUTPUT
Pout(dBm)

9
COMMUNICATION DEVICE
2
RADIO FREQUENCY CIRCUIT
6
102
84
82
83
81
200
50
30
31b
32b
301
302
31a
32a
40
11
Carrier
12
Peak
110
120
RF1
RF2
PS
70
15
RF0
101
RFIC
7

CARRIER AMPLIFIER ON
PEAK AMPLIFIER ON
52
110
11
Carrier
130
13
Carrier
120
12
Peak
40
41
36a
36b
351
352
37a
37b
35
31a
31b
301
302
32a
32b
30
200

CARRIER AMPLIFIER ON
PEAK AMPLIFIER OFF
52
110
11
Carrier
130
13
Carrier
120
12
Peak
40
41
36a
36b
351
352
37a
37b
35
301
302
30
200

CARRIER AMPLIFIER (11) ON
CARRIER AMPLIFIER (13) OFF
PEAK AMPLIFIER OFF
Zp1=RL×4/n
52
110
11
Carrier
130
13
Carrier
40
RL×1/n
41
12
120
Peak
351
352
35
301
302
30
200
RL
RL×1/n (a)
2
12
11
60
40
y
z
x
90
SIXTH DIRECTION
VIIIB
301
VIIIB
FIFTH DIRECTION
(b)
2
60
301
90
z
y
x

RADIO FREQUENCY CIRCUIT AND COMMUNICATION DEVICE

CROSS-REFERENCE TO RELATED APPLICATIONS

This application is a continuation of international application no. PCT/JP2022/022226 filed May 31, 2022, which claims priority to Japanese application no. 2021-093181, filed Jun. 2, 2021. The entire contents of both prior applications are hereby incorporated by reference.

TECHNICAL FIELD

The present disclosure relates to radio frequency circuits and communication devices.

BACKGROUND ART

A power amplifier circuit includes a first amplifier, a second amplifier, an amplifier output phase shifter that is connected between an output terminal of the first amplifier and an output terminal of the second amplifier and adjusts the phase of an output signal of the first amplifier, and a transformer connected to the amplifier output phase shifter and the output terminal of the second amplifier.

CITATION LIST

Patent Document

Patent Document 1: Japanese Unexamined Patent Application Publication No. 2013-85179

SUMMARY

Technical Problem

In the power amplifier circuit disclosed discussed above, the amplifier output phase shifter is a circuit for adjusting the phase of ¼ of a wavelength, and thus in the case where the power amplifier circuit is made up of an inductor and a capacitor or made up of a transmission line, the size of the power amplifier circuit increases.

Aspects of the present disclosure resolve the foregoing issue, and provide a small radio frequency circuit and a small communication device, each of which has a plurality of amplifying elements and a phase shifting circuit.

Solution to Problem

Aspects of the present disclosure include a radio frequency circuit that includes: a first amplifying element and a second amplifying element; a transformer having an input side coil and an output side coil; a signal output terminal; and a first circuit, wherein one end portion of the input side coil is connected to an output terminal of the first amplifying element, one end portion of the output side coil is connected to the signal output terminal, and another end portion of the output side coil is connected to ground, the first circuit has a first main line and a first auxiliary line, one end portion of the first main line is connected to an output terminal of the second amplifying element, and another end portion of the first main line is connected to another end portion of the input side coil, one end portion of the first auxiliary line is connected to the one end portion of the first main line, and another end portion of the first auxiliary line is connected to the ground, and a first direction directed from the one end portion to the another end portion of the first main line and a second direction directed from the another end portion to the one end portion of the first auxiliary line are same.

Further, a radio frequency circuit according to one aspect of the present disclosure includes: a first amplifying element and a second amplifying element; a first transmission line; a signal output terminal; and a first circuit, wherein the first transmission line is connected between an output terminal of the first amplifying element and an output terminal of the second amplifying element, the first circuit has a first main line and a first auxiliary line, one end portion of the first main line is connected to one end portion of the first transmission line, and another end portion of the first main line is connected to the signal output terminal, another end portion of the first transmission line is connected to the output terminal of the first amplifying element, one end portion of the first auxiliary line is connected to the one end portion of the first main line, and another end portion of the first auxiliary line is connected to ground, and a first direction directed from the one end portion to the another end portion of the first main line and a second direction directed from the another end portion to the one end portion of the first auxiliary line are same.

Exemplary Advantageous Effects

According to the present disclosure, it becomes possible to provide a radio frequency circuit and a communication device, each of which has a plurality of amplifying elements and a phase shifting circuit.

DETAILED DESCRIPTION

Figure 1:
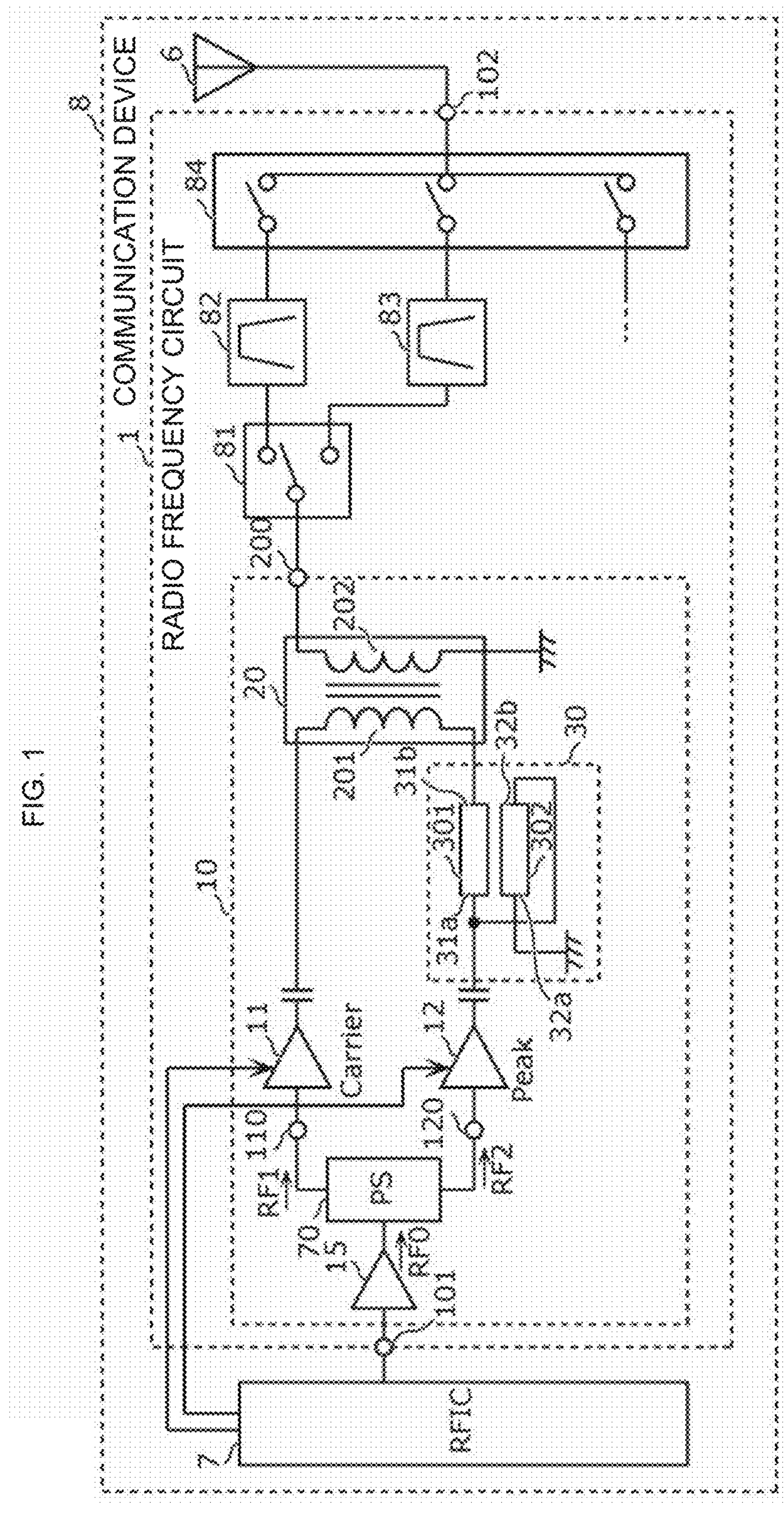
FIG. 1 is a circuit configuration diagram of a radio frequency circuit and a communication device according to an exemplary embodiment 1.

Hereinafter, exemplary embodiments of the present disclosure will be described in detail with reference to the drawings. Note that the exemplary embodiments, which will be described below, each illustrate a comprehensive or specific example. Numeric values, shapes, materials, constituent elements, arrangements and connection modes of the constituent elements, and the like illustrated in the following exemplary embodiments are mere examples, and not intended to limit the present disclosure.

Note that each drawing is a schematic diagram in which emphasis, omission, or ratio adjustment is made if appropriate to illustrate the present disclosure and is not precisely drawn, and in some cases, the shape, spatial relationship, and ratio are different from the actual ones. In the drawings, the same reference characters are given to substantially the same constituent element, and in some cases an overlapping description is omitted or simplified.

In the present disclosure, "being connected" is defined to mean not only the case of being directly connected by a connection terminal and/or a wiring conductor but also the case of being electrically connected via another circuit element. Further, "being connected in between A and B" and "being connected between A and B" are defined to mean to be connected to both A and B in a path connecting A and B.

Further, in the present disclosure, "planar view" means to see an object by orthographically projecting the object onto a x-y plane from the z-axis positive direction side. "A component is arranged on a principal surface of a board" is defined to mean not only the case where the component is arranged on the principal surface of the board while the component is touching the principal surface of the board, but also the case where the component is arranged above the principal surface without touching the principal surface of the board and the case where the component is arranged in such a way that part of the component is buried in the board from the principal surface side.

Further, in the present disclosure, "C is arranged in an intersecting part of a first direction of A and a second direction of B" is defined to mean that in a planar view, C includes an intersection point of a line extending in the first direction from an arbitrary point in the inside of A and a line extending in the second direction from an arbitrary point in the inside of B. Further, terms indicating relationships among constituent elements such as "parallel", "vertical", and the like and terms indicating shapes of constituent elements such as "rectangle" and the like are used not only to represent their precise meanings but also means to include their substantially equivalent ranges, for example, within errors of about few %. Further, "a first direction and a second direction are the same" is defined to mean not only the case where the angle formed by a directional vector of the first direction and a directional vector of the second direction is precisely 0 degrees but also the case where the angle formed by these two directional vectors is equal to or greater than −10 degrees and equal to or less than +10 degrees.

Further, in the present disclosure, "signal path" is defined to mean a transmission line made up of a wiring line through which a radio frequency signal propagates, an electrode directly connected to the wiring line, a terminal directly connected to the wiring line or the electrode, and the like.

Embodiment 1

1. Circuit Configurations of Radio Frequency Circuit 1 and Communication Device 8

Circuit configurations of a radio frequency circuit 1 and a communication device 8 according to the present exemplary embodiment are described with reference to FIG. 1. FIG. 1 is a circuit configuration diagram of the radio frequency circuit 1 and the communication device 8 according to an exemplary embodiment 1.

1.1 Circuit Configuration of Communication Device 8

First, the circuit configuration of the communication device 8 is described. As illustrated in FIG. 1, the communication device 8 according to the present exemplary embodiment includes the radio frequency circuit 1, an antenna 6, and a RF signal processing circuit (RFIC) 7.

The radio frequency circuit 1 transmits a radio frequency signal between the antenna 6 and the RFIC 7. Details of the circuit configuration of the radio frequency circuit 1 will be described later.

The antenna 6 is connected to an antenna connection terminal 102 of the radio frequency circuit 1, transmits a radio frequency signal output from the radio frequency circuit 1, receives a radio frequency signal from outside, and outputs a received radio frequency signal to the radio frequency circuit 1.

The RFIC 7 is an example of a signal processing circuit that performs processing on a radio frequency signal. Specifically, the RFIC 7 performs signal processing such as down-converting and the like on a reception signal input via a reception path of the radio frequency circuit 1, and outputs a reception signal generated by this signal processing to a base band signal processing circuit (BBIC, not illustrated). Further, the RFIC 7 performs signal processing such as up-converting and the like on a transmission signal input from the BBIC, and outputs a transmission signal generated by this signal processing to a transmission path of the radio frequency circuit 1. Further, the RFIC 7 has a control part that controls switches, amplifying elements, and the like included in the radio frequency circuit 1. Note that part or all the functions of the control part of the RFIC 7 may be installed outside the RFIC 7. For example, part or all the functions of the control part of the RFIC 7 may be installed in the BBIC or the radio frequency circuit 1.

Further, the RFIC 7 also functions as a control part that controls a power voltage Vcc and a bias voltage Vbias to be supplied to each amplifier included in the radio frequency circuit 1. Specifically, the RFIC 7 outputs digital control signals to the radio frequency circuit 1. Each amplifier of the radio frequency circuit 1 receives supply of the power voltage Vcc and the bias voltage Vbias that are controlled by the foregoing digital control signal.

Further, based on the communication band (frequency band) to be used, the RFIC 7 also functions as a control part that controls connections of switches 81 and 84 included in the radio frequency circuit 1.

Note that in the communication device 8 according to the present exemplary embodiment, the antenna 6 may be omitted without departing from the scope of the present disclosure.

1.2 Circuit Configuration of Radio Frequency Circuit 1

Next, the circuit configuration of the radio frequency circuit 1 is described. As illustrated in FIG. 1, the radio frequency circuit 1 includes an amplifier circuit 10, filters 82 and 83, switches 81 and 84, an input terminal 101, and an antenna connection terminal 102.

The input terminal 101 is connected to the RFIC 7, and the antenna connection terminal 102 is connected to the antenna 6.

The amplifier circuit 10 is a circuit that amplifies transmission signals of a band A and a band B input from the input terminal 101. Note that instead of the amplifier circuit 10, the radio frequency circuit 1 may include a first amplifier circuit that amplifies a radio frequency signal of the band A and a second amplifier circuit that amplifies a radio frequency signal of the band B.

Note that in the present exemplary embodiment, each of the band A and the band B is defined to mean a frequency band predefined by a standards group for constructing a communication system using a radio access technology (RAT) (for example, 3GPP (Registered Trademark) (3rd Generation Partnership Project), IEEE (Institute of Electrical and Electronics Engineers), and the like) or any other similar group. In the present exemplary embodiment, as the communication system, for example, a 4G (4th Generation)-LTE (Long Term Evolution) system, a 5G (5th Generation)-NR (New Radio) system, a WLAN (Wireless Local Area Network) system, and the like can be used. However, the communication system is not limited thereto.

The filter 82 is connected between the switches 81 and 84. Further, of the transmission signals amplified by the amplifier circuit 10, the filter 82 allows a transmission signal of a transmission band of the band A to pass. The filter 83 is connected between the switches 81 and 84. Further, of the transmission signals amplified by the amplifier circuit 10, the filter 83 allows a transmission signal of a transmission band of the band B to pass.

Note that each of the filters 82 and 83 may make up a duplexer with a filter for reception or may be a single filter that carries out the transmission using a time division duplex (TDD) system. In the case where the filters 82 and 83 are filters for TDD, the foregoing single filter is preceded, followed, or preceded and followed by a switch that switches between transmission and reception.

The switch 81 has a common terminal, a first selection terminal, and a second selection terminal. The common terminal is connected to a signal output terminal 200 of the amplifier circuit 10. The first selection terminal is connected to the filter 82, and the second selection terminal is connected to the filter 83. With this connection configuration, the switch 81 switches between connecting the amplifier circuit 10 to the filter 82 and connecting the amplifier circuit 10 to the filter 83.

The switch 84 is an example of an antenna switch and is connected to the antenna connection terminal 102. Moreover, the switch 84 switches between connecting and disconnecting the antenna connection terminal 102 to and from the filter 82 and switches between connecting and disconnecting the antenna connection terminal 102 to and from the filter 83.

Note that the radio frequency circuit 1 may include a reception circuit for transmitting a reception signal, which is received from the antenna 6, to the RFIC 7. In this case, the radio frequency circuit 1 includes a low-noise amplifier and a filter for reception.

Further, an impedance matching circuit may be arranged in between the signal output terminal 200 and the antenna connection terminal 102.

According to the foregoing circuit configuration, the radio frequency circuit 1 can transmit or receive a radio frequency signal of the band A or the band B. Moreover, the radio frequency circuit 1 can also at least carry out one of simultaneous transmission, simultaneous reception, and simultaneous transmission and reception of radio frequency signals of the band A and the band B.

Note that, of the circuit configuration illustrated in FIG. 1, the radio frequency circuit 1 according to the present disclosure may only include at least the amplifier circuit 10.

Here, the circuit configuration of the amplifier circuit 10 is described in detail.

As illustrated in FIG. 1, the amplifier circuit 10 includes a carrier amplifier 11, a peak amplifier 12, a pre-amplifier 15, a phase shifting circuit 70, a transformer 20, an impedance converting circuit 30, and the signal output terminal 200.

The pre-amplifier 15 amplifies a radio frequency signal of the band A and/or a radio frequency signal of the band B input from the input terminal 101.

The phase shifting circuit 70 splits a signal RF0 output from the pre-amplifier 15 and outputs these split signals RF1 and RF2 to the carrier amplifier 11 and the peak amplifier 12 via terminals 110 and 120, respectively. In doing so, the phase shifting circuit 70 adjusts the phases of the signals RF1 and RF2. For example, the phase shifting circuit 70 shifts the phase of the signal RF2 by −90 degrees relative to the signal RF1 (delays 90 degrees).

Note that the configurations of the pre-amplifier 15 and the phase shifting circuit 70 are not limited to the foregoing configurations. For example, each of the carrier amplifier 11 and the peak amplifier 12 may be preceded by the pre-amplifier 15. In this case, each of the pre-amplifiers or each of the carrier amplifier 11 and the peak amplifier 12 may be preceded by the phase shifting circuit 70. Further, the amplifier circuit 10 may not include the pre-amplifier 15 and the phase shifting circuit 70 without departing from the scope of the present disclosure.

Each of the carrier amplifier 11 and the peak amplifier 12 has an amplifying transistor. The foregoing amplifying transistor is, for example, a bipolar transistor such as a Heterojunction Bipolar Transistor (HBT) or the like, or a field effect transistor such as a MOSFET (Metal-Oxide-Semiconductor Field Effect Transistor) or the like.

The carrier amplifier 11 is an example of a first amplifying element and is a Class A (or Class AB) amplifier circuit capable of performing amplifying operation in all the power levels of the signal RF1. Particularly, the carrier amplifier 11 can perform a highly efficient amplifying operation in a low output range and a middle output range. Note that the first amplifying element according to the present disclosure may only include a Class A (or Class AB) amplifier circuit and is not limited to the carrier amplifier.

Note that in the present disclosure, the efficiency indicates "power added efficiency".

The peak amplifier 12 is an example of a second amplifying element and is, for example, a Class C amplifier circuit capable of performing amplifying operation in a high range of power level of the signal RF2. The bias voltage applied to the amplifying transistor included in the peak amplifier 12 is lower than the bias voltage applied to the amplifying transistor included in the carrier amplifier 11. Thus, the output impedance decreases as the power level of the signal RF2 increases. Because of this, the peak amplifier 12 can carry out low distortion amplifying operation in a high output range. Note that the second amplifying element according to the present disclosure may only include a Class C amplifier circuit and is not limited to the peak amplifier.

The transformer 20 has an input side coil 201 and an output side coil 202. One end portion of the input side coil 201 is connected to an output terminal of the carrier amplifier 11, and the other end portion of the input side coil 201 is connected to the other end portion 31*b* of a main line 301 of the impedance converting circuit 30. One end portion of the output side coil 202 is connected to the signal output terminal 200, and the other end portion of the output side coil 202 is connected to ground.

With the foregoing connection configuration of the transformer 20, a signal output from the carrier amplifier 11 and a signal output from the peak amplifier 12 are added in voltage, and a combined output signal is output from the signal output terminal 200.

The impedance converting circuit 30 is an example of a first circuit and has the main line 301 and an auxiliary line 302. The impedance converting circuit 30 shifts the phase to have different phases at two end ports thereof and further converts the impedance with a predetermined converting ratio. The main line 301 is an example of a first main line and is, for example, a transmission line having a length of ⅛ of a wavelength or 1/16 of the wavelength. One end portion 31*a* of the main line 301 is connected to an output terminal of the peak amplifier 12, and the other end portion 31*b* of the main line 301 is connected to the other end portion of the input side coil 201. The auxiliary line 302 is an example of a first auxiliary line and is, for example, a transmission line having a length of ⅛ of the wavelength or 1/16 of the wavelength. One end portion 32*b* of the auxiliary line 302 is connected to the one end portion 31*a* of the main line 301, and the other end portion 32*a* of the auxiliary line 302 is connected to the ground. A first direction directed from the one end portion 31*a* to the other end portion 31*b* of the main line 301 and a second direction directed from the other end portion 32*a* to the one end portion 32*b* of the auxiliary line 302 are the same. With the foregoing configuration, the main line 301 and the auxiliary line 302 are electromagnetically coupled with each other. Note that in the case where the main line 301 and the auxiliary line 302 are seen from an arbitrary direction that is vertical to the extending direction of the main line 301 and the auxiliary line 302, it is preferrable that the foregoing first direction and the foregoing second direction are the same.

1.3 Operation of Doherty-Type Amplifier Circuit

First, operation of the amplifier circuit 10 according to the present exemplary embodiment is described.

Figures 2A, 2B:
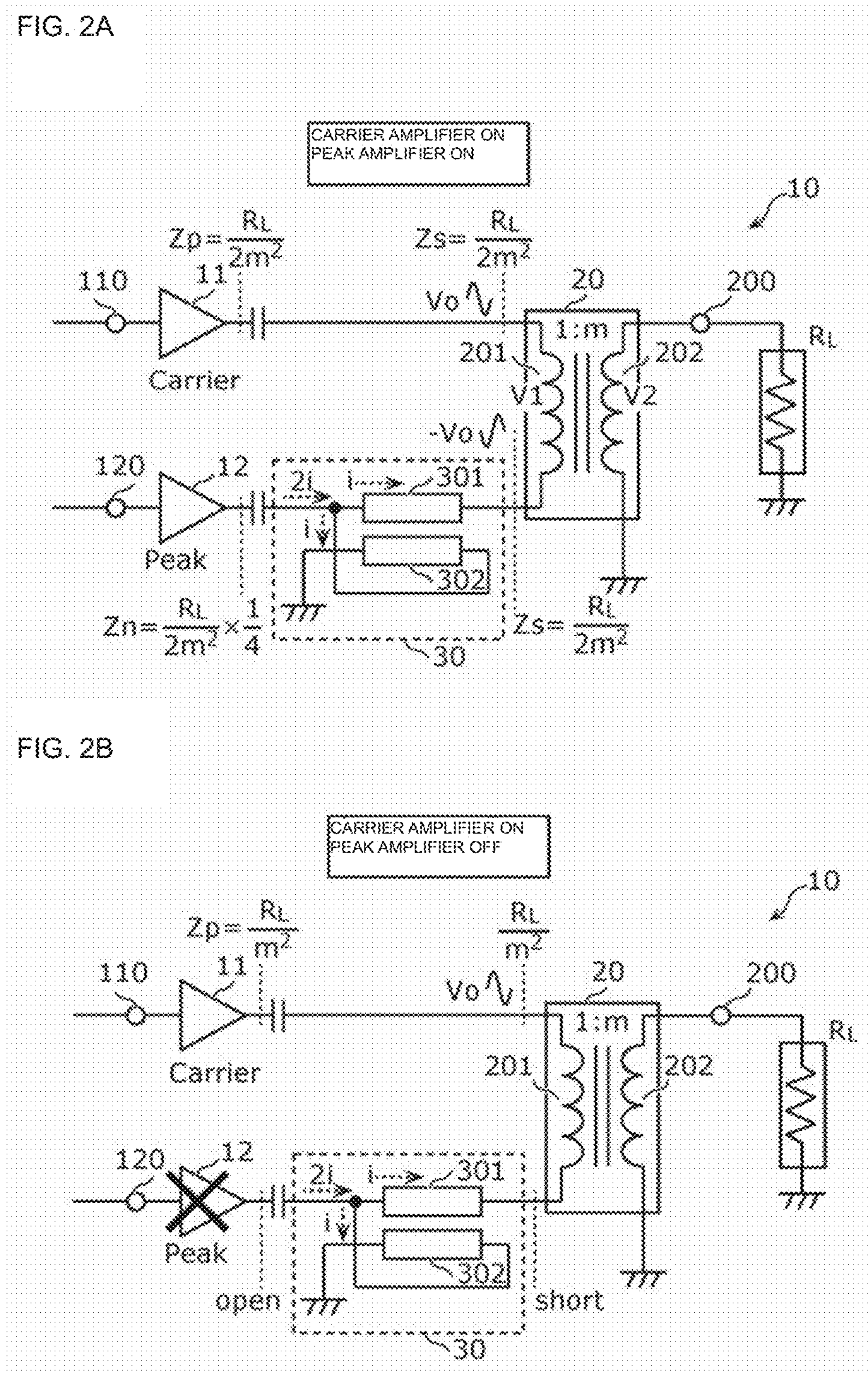
FIG. 2A is a circuit state diagram of an amplifier circuit according to the exemplary embodiment 1 at time of receiving a large signal.
FIG. 2B is a circuit state diagram of the amplifier circuit according to the exemplary embodiment 1 at time of receiving a small signal.

FIG. 2A is a circuit state diagram of the amplifier circuit 10 according to the exemplary embodiment 1 at the time of receiving a large signal. Further, FIG. 2B is a circuit state diagram of the amplifier circuit 10 according to the exemplary embodiment 1 at the time of receiving a small signal.

First, as illustrated in FIG. 2A, when the carrier amplifier 11 and the peak amplifier 12 are in operation (ON) (at the time of receiving a large signal), an impedance Zp looking from the output terminal of the carrier amplifier 11 into a load side (hereinafter, denoted as "output impedance Zp of the carrier amplifier 11") and an impedance Zn looking from the output terminal of the peal amplifier 12 into a load side (hereinafter, denoted as "output impedance Zn of the peak amplifier 12") are expressed as in Equation 1. Note that the transformer 20 transforms the voltage with a ratio of 1:m. Further, V1 is the voltage across two end portions of the input side coil 201, V2 is the voltage across two end portions of the output side coil 202, and it is the current flowing through each of the main line 301 and the auxiliary line 302. Further, Vo is the output voltage of each amplifier. Further, RL is the impedance of a load to be connected to the signal output terminal 200. As described in Equation 1, because of the impedance converting circuit 30, the impedance Zn of an input port of the impedance converting circuit 30 (the output terminal of the peak amplifier 12) becomes ¼ of an impedance Zs of an output port of the impedance converting circuit 30 (the other end portion of the input side coil 201).

[Math. 1]

$$V2 = mV1 = 2mVo,\ i2 = \frac{1}{m}i1 \quad \text{(Equation 1)}$$

$$RL = \frac{V2}{i2} = \frac{2m^2Vo}{i1}$$

$$Z_p = \frac{Vo}{i1} = \frac{RL}{2m^2}$$

$$\frac{Zn}{Zs} = \frac{W_0/(2i)^2}{W_0/i^2} = \frac{1}{4},\ Zn = \frac{1}{4} \times \frac{RL}{2m^2}$$

Next, as illustrated in FIG. 2B, when the carrier amplifier 11 is in operation (ON) and the peak amplifier 12 is not in operation (OFF) (at the time of receiving a small signal), the output impedance Zp of the carrier amplifier 11 is expressed as in Equation 2. Note that at this time, the output impedance Zn of the peak amplifier 12 is in an open-circuit state.

[Math. 2]

$$V2 = mV1 = mVo,\ i2 = \frac{1}{m}i1 \quad \text{(Equation 2)}$$

$$RL = \frac{V2}{i2} = \frac{m^2Vo}{i1}$$

$$Z_p = \frac{Vo}{i1} = \frac{RL}{m^2}$$

As described in Equation 1 and Equation 2, compared with the time of receiving a large signal, at the time of receiving a small signal, the output impedance Zp of the carrier amplifier 11 increases twofold. That is to say, at the time of receiving a small signal, the peak amplifier 12 turns to an OFF state, and the output impedance Zp of the carrier amplifier 11 increases, and this enables the amplifier circuit 10 to operate with high efficiency.

On the other hand, at the time of receiving a large signal, a high-power signal can be output because the carrier amplifier 11 and the peak amplifier 12 operate, and further the signal distortion can be suppressed because the output impedance Zn of the peak amplifier 12 is low.

As described above, the impedance converting circuit 30 has a function of converting the impedance (Zn and Zs) at two end ports of the impedance converting circuit 30 and further shifts the phase of the signal output from the peak amplifier 12 by −90 degrees (delays 90 degrees). With the arrangement of the impedance converting circuit 30, the phase of the signal output from the carrier amplifier 11 and the phase of the signal output from the peak amplifier 12 are set in such a manner as to be in opposite phase. Because of this, the signal output from the carrier amplifier 11 and the signal output from the peak amplifier 12 are combined in voltage in the transformer 20. Note that in the impedance converting circuit 30, the main line 301 and the auxiliary line 302 each have a length that is shorter than ¼ of the wavelength and is equal to, for example, a length of ⅛ of the wavelength or 1/16 of the wavelength.

Next, operation of a related art Doherty-type amplifier circuit 500 is described.

Figures 3A, 3B:
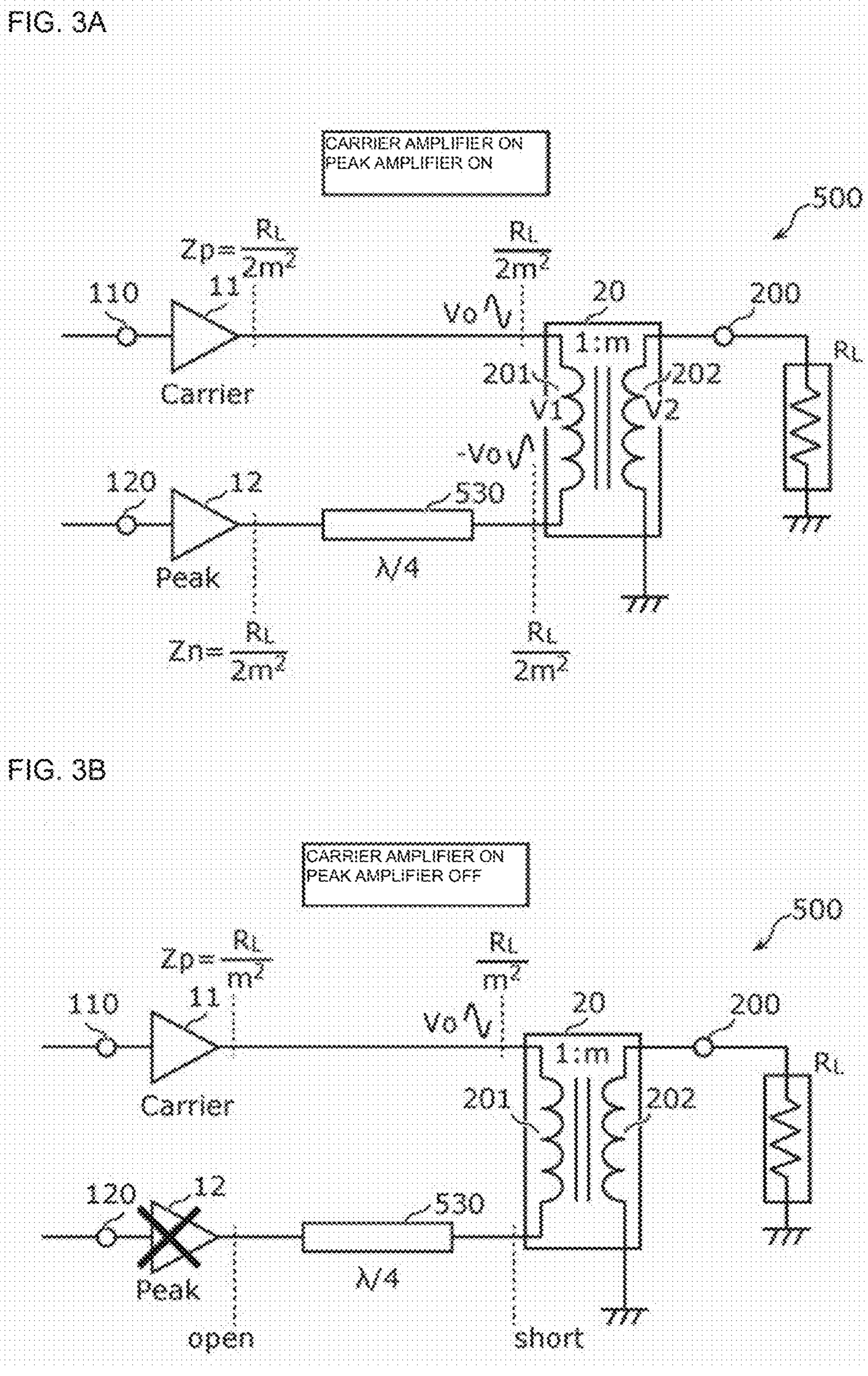
FIG. 3A is a circuit state diagram of a related art Doherty-type amplifier circuit at time of receiving a large signal.
FIG. 3B is a circuit state diagram of the related art Doherty-type amplifier circuit at time of receiving a small signal.

FIG. 3A is a circuit state diagram of the related art Doherty-type amplifier circuit 500 at the time of receiving a large signal. Further, FIG. 3B is a circuit state diagram of the related art Doherty-type amplifier circuit 500 at the time of receiving a small signal.

The related art Doherty-type amplifier circuit 500 is different from the amplifier circuit 10 according to the exemplary embodiment 1 in that a quarter-wavelength transmission line 530 is arranged instead of the impedance converting circuit 30. In the following section, the circuit configuration of the related art amplifier circuit 500 is described with an emphasis on a configuration different from the amplifier circuit 10 according to the exemplary embodiment.

The quarter-wavelength transmission line 530 is arranged between the output terminal of the peak amplifier 12 and the other end portion of the input side coil 201.

First, as illustrated in FIG. 3A, when the carrier amplifier 11 and the peak amplifier 12 are in operation (ON) (at the time of receiving a large signal), the output impedance Zp of the carrier amplifier 11 and the output impedance Zn of the peak amplifier 12 are expressed as in Equation 3. Note that i1 is the current flowing through the input side coil 201.

[Math. 3]

$$V2 = mV1 = 2mVo,\ i2 = \frac{1}{m}i1 \quad \text{(Equation 3)}$$

$$RL = \frac{V2}{i2} = \frac{2m^2 Vo}{i1}$$

$$Z_p = Zn = \frac{Vo}{i1} = \frac{RL}{2m^2}$$

Next, as illustrated in FIG. 3B, when the carrier amplifier 11 is in operation (ON) and the peak amplifier 12 is not in operation (OFF) (at the time of receiving a small signal), the output impedance Zp of the carrier amplifier 11 is expressed as in Equation 4. Note that at this time, the output impedance Zn of the peak amplifier 12 is in the open-circuit state.

[Math. 4]

$$V2 = mV1 = 2mVo,\ i2 = \frac{1}{m}i1 \quad \text{(Equation 4)}$$

$$RL = \frac{V2}{i2} = \frac{m^2 Vo}{i1}$$

$$Z_p = \frac{Vo}{i1} = \frac{RL}{m^2}$$

As described in Equation 3 and Equation 4, compared with the time of receiving a large signal, at the time of receiving a small signal, the output impedance Zp of the carrier amplifier 11 increases twofold. That is to say, at the time of receiving a small signal, the peak amplifier 12 turns to the OFF state, and the output impedance Zp of the carrier amplifier 11 increases, and this enables the amplifier circuit 500 to operate with high efficiency.

On the other hand, at the time of receiving a large signal, a high-power signal can be output because the carrier amplifier 11 and the peak amplifier 12 operate, and further the signal distortion can be suppressed because the output impedance Zn of the peak amplifier 12 is low.

The quarter-wavelength transmission line 530 shifts the phase of the signal output from the peak amplifier 12 by −90 degrees (delays 90 degrees). With the arrangement of the quarter-wavelength transmission line 530, the phase of the signal output from the carrier amplifier 11 and the phase of the signal output from the peak amplifier 12 are set in such a manner as to be in opposite phase. Because of this, the signal output from the carrier amplifier 11 and the signal output from the peak amplifier 12 are combined in voltage in the transformer 20.

Figure 4:
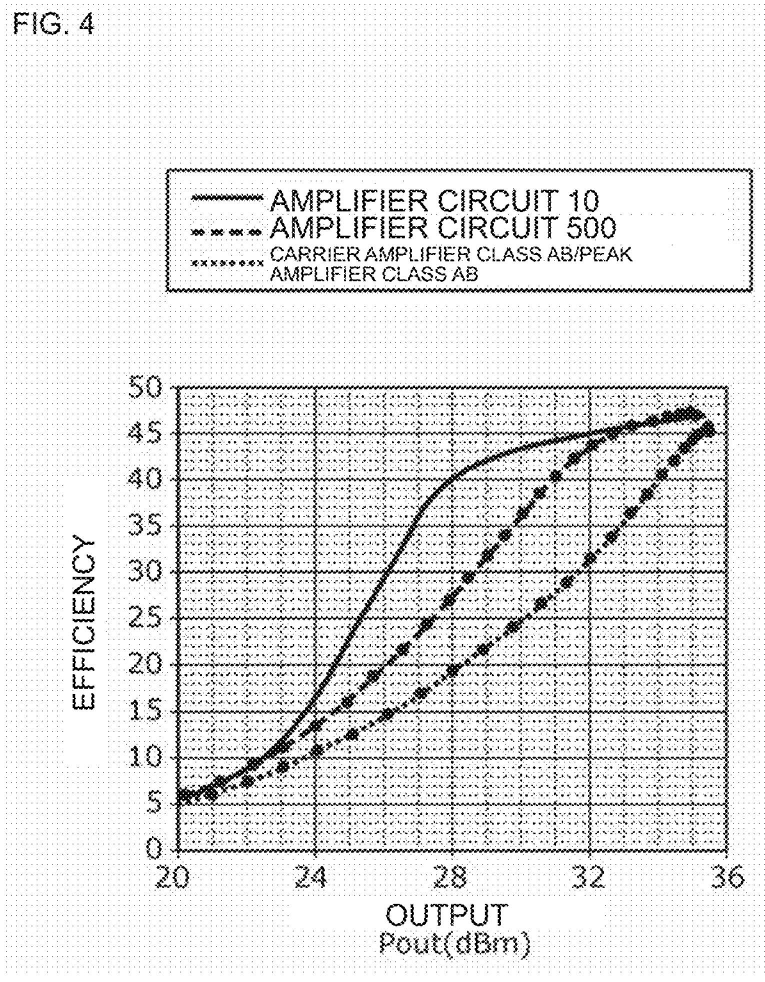
FIG. 4 is a graph that compares amplifying characteristics of the related art amplifier circuit and the amplifier circuit according to the exemplary embodiment 1.

FIG. 4 is a graph that compares amplifying characteristics of the related art amplifier circuit 500 and the amplifier circuit 10 according to the exemplary embodiment 1. In FIG. 4, the horizontal axis is the power level of a signal output from the signal output terminal 200, and the vertical axis is the efficiency (power added efficiency) of each amplifier circuit.

Compared with an amplifier circuit in which both the carrier amplifier 11 and the peak amplifier 12 are in Class AB operation, in the related art amplifier circuit 500, the efficiency is improved because of high impedance operation of the carrier amplifier 11 in the low output range and low signal distortion caused by low impedance operation of the peak amplifier 12 in the high output range.

In contrast, furthermore, compared with the amplifier circuit 500, in the amplifier circuit 10 according to the present exemplary embodiment, the efficiencies in the high output operation and the middle output range are improved because of additional high impedance operation of the carrier amplifier 11 caused by the impedance converting circuit 30 and low impedance operation of the peak amplifier 12 in the high output range.

Further, in the radio frequency circuit 1 according to the present exemplary embodiment, instead of the quarter-wavelength transmission line 530, the impedance converting circuit 30 made up of the lines shorter than ¼ of the wavelength is arranged, and thus, it becomes possible to downsize the radio frequency circuit 1.

1.4 Exemplary Advantageous Effects and the Like

As described above, the radio frequency circuit 1 according to the present exemplary embodiment includes the carrier amplifier 11 and the peak amplifier 12, the transformer 20 having the input side coil 201 and the output side coil 202, the signal output terminal 200, and the impedance converting circuit 30, wherein one end portion of the input side coil 201 is connected to the output terminal of the carrier amplifier 11, one end portion of the output side coil 202 is connected to the signal output terminal 200, the other end portion of the output side coil 202 is connected to the ground, the impedance converting circuit 30 has the main line 301 and the auxiliary line 302, the one end portion 31*a* of the main line 301 is connected to an output terminal of the peak amplifier 12, and the other end portion 31*b* of the main line 301 is connected to the other end portion of the input side coil 201, the one end portion 32*b* of the auxiliary line 302 is connected to the one end portion 31*a* of the main line 301, and the other end portion 32*a* of the auxiliary line 302 is connected to the ground, and the first direction directed from the one end portion 31*a* to the other end portion 31*b* of the main line 301 and the second direction directed from the other end portion 32*a* to the one end portion 32*b* of the auxiliary line 302 are the same.

According to this, instead of the quarter-wavelength transmission line, the impedance converting circuit 30 made up of the lines shorter than ¼ of the wavelength is arranged, and thus, it becomes possible to downsize the radio frequency circuit 1. Further, because the output impedance of the peak amplifier 12 can be reduced, the signal distortion can be reduced in the high output range.

Further, the communication device 8 according to the present exemplary embodiment includes the RFIC 7 that performs processing on a radio frequency signal and the radio frequency circuit 1 that transmits a radio frequency signal between the RFIC 7 and the antenna 6.

According to this, it becomes possible to realize at least these exemplary advantageous effects of the radio frequency circuit 1 in the communication device 8.

Embodiment 2

In the exemplary embodiment 1, a voltage-combining-type Doherty amplifier circuit is described. In the present exemplary embodiment, a current-combining-type Doherty amplifier circuit is described.

2. Circuit Configurations of Radio Frequency Circuit 2 and Communication Device 9

Figure 5:
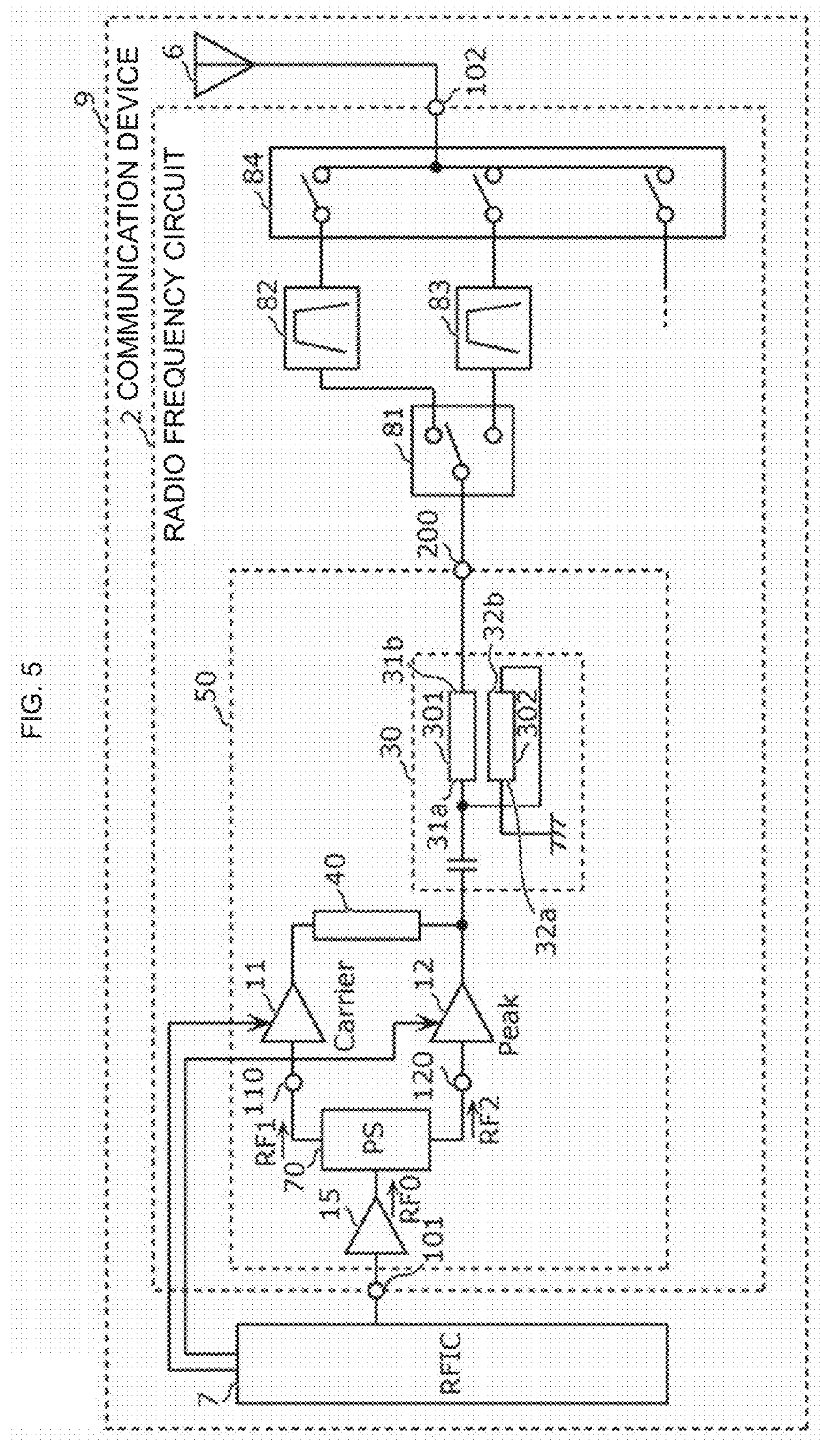
FIG. 5 is a circuit configuration diagram of a radio frequency circuit and a communication device according to an exemplary embodiment 2.

Circuit configurations of a radio frequency circuit 2 and a communication device 9 according to the present exemplary embodiment are described with reference to FIG. 5. FIG. 5 is a circuit configuration diagram of the radio frequency circuit 2 and the communication device 9 according to an exemplary embodiment 2.

2.1 Circuit Configuration of Communication Device 9

First, the circuit configuration of the communication device 9 is described. As illustrated in FIG. 5, the communication device 9 according to the present exemplary embodiment includes the radio frequency circuit 2, an antenna 6, and a RFIC 7. The communication device 9 according to the present exemplary embodiment is different from the communication device 8 according to the exemplary embodiment 1 only in the configuration of the radio frequency circuit 2. In the following section, with regard to the communication device 9 according to the present exemplary embodiment, the configuration of the radio frequency circuit 2, which is different from that of the communication device 8 according to the exemplary embodiment 1, is described.

2.2 Configuration of Radio Frequency Circuit 2

As illustrated in FIG. 5, the radio frequency circuit 2 includes an amplifier circuit 50, the filters 82 and 83, the switches 81 and 84, the input terminal 101, and the antenna connection terminal 102. The radio frequency circuit 2 according to the present exemplary embodiment is different from the radio frequency circuit 1 according to the exemplary embodiment 1 only in the configuration of the amplifier circuit 50. In the following section, the radio frequency circuit 2 according to the present exemplary embodiment is described with an emphasis on the configuration of the amplifier circuit 50.

The amplifier circuit 50 is a circuit that amplifies transmission signals of the band A and the band B input from the input terminal 101. The radio frequency circuit 2 can transmit or receive a radio frequency signal of the band A or the band B. Moreover, the radio frequency circuit 2 can also at least carry out one of simultaneous transmission, simultaneous reception, and simultaneous transmission and reception of radio frequency signals of the band A and the band B.

Note that, of the circuit configuration illustrated in FIG. 5, the radio frequency circuit 2 according to the present disclosure may only have at least the amplifier circuit 50.

Here, the circuit configuration of the amplifier circuit 50 is described in detail.

As illustrated in FIG. 5, the amplifier circuit 50 includes the carrier amplifier 11, the peak amplifier 12, the pre-amplifier 15, the phase shifting circuit 70, a quarter-wavelength transmission line 40, the impedance converting circuit 30, and the signal output terminal 200.

The pre-amplifier 15 and the phase shifting circuit 70 have the same configurations and functions as those of pre-amplifier 15 and the phase shifting circuit 70 included in the amplifier circuit 10 according to the exemplary embodiment 1, and thus the descriptions thereof are omitted here.

Each of the carrier amplifier 11 and the peak amplifier 12 has an amplifying transistor. The foregoing amplifying transistor is, for example, a bipolar transistor such as a HBT or the like, or a field effect transistor such as a MOSFET or the like.

The carrier amplifier 11 is an example of the first amplifying element and is a Class A (or Class AB) amplifier circuit capable of performing amplifying operation in all the power levels of the signal RF1. Particularly, the carrier amplifier 11 can perform a highly efficient amplifying operation in the low output range and the middle output range.

The peak amplifier 12 is an example of the second amplifying element and is, for example, a Class C amplifier circuit capable of performing amplifying operation in high range of power level of the signal RF2. The bias voltage applied to the amplifying transistor included in the peak amplifier 12 is lower than the bias voltage applied to the amplifying transistor included in the carrier amplifier 11. Thus, the output impedance decreases as the power level of the signal RF2 increases. Because of this, the peak amplifier 12 can carry out low distortion amplifying operation in the high output range.

The quarter-wavelength transmission line 40 is an example of a first transmission line and is connected between the output terminal of the carrier amplifier 11 and the output terminal of the peak amplifier 12. The quarter-wavelength transmission line 40 shifts the phase of the signal output from the carrier amplifier 11 by −90 degrees (delays 90 degrees). With the arrangement of the quarter-wavelength transmission line 40, the phase of the signal output from the carrier amplifier 11 and the phase of the signal output from the peak amplifier 12 are set in the same phase. Because of this, the signal output from the carrier amplifier 11 and the signal output from the peak amplifier 12 are combined in current.

The impedance converting circuit 30 is an example of the first circuit and has the main line 301 and the auxiliary line 302. The impedance converting circuit 30 shifts the phase to have different phases at two end ports thereof and further converts the impedance with a predetermined converting ratio. The main line 301 is an example of the first main line and is, for example, a transmission line having a length of ⅛ of the wavelength or 1/16 of the wavelength. The one end portion 31*a* of the main line 301 is connected to one end portion of the quarter-wavelength transmission line 40, and the other end portion 31*b* of the main line 301 is connected to the signal output terminal 200. The other end portion of the quarter-wavelength transmission line 40 is connected to the output terminal of the carrier amplifier 11. The auxiliary line 302 is an example of the first auxiliary line and is, for example, a transmission line having a length of ⅛ of the wavelength or 1/16 of the wavelength. The one end portion 32*b* of the auxiliary line 302 is connected to the one end portion 31*a* of the main line 301, and the other end portion 32*a* of the auxiliary line 302 is connected to the ground. The first direction directed from the one end portion 31*a* to the other end portion 31*b* of the main line 301 and the second direction directed from the other end portion 32*a* to the one end portion 32*b* of the auxiliary line 302 are the same. With the foregoing configuration, the main line 301 and the auxiliary line 302 are electromagnetically coupled with each other. Note that in the case where the main line 301 and the auxiliary line 302 are seen from an arbitrary direction that is vertical to the extending direction of the main line 301 and the auxiliary line 302, it is preferrable that the foregoing first direction and the foregoing second direction are the same.

With the foregoing configuration of the amplifier circuit 50, compared with the time of receiving a large signal, at the time of receiving a small signal, the output impedance of the carrier amplifier 11 increases. That is to say, at the time of receiving a small signal, the peak amplifier 12 turns to the OFF state, and the output impedance of the carrier amplifier 11 increases, and this enables the amplifier circuit 50 to operate with high efficiency.

On the other hand, at the time of receiving a large signal, a high-power signal can be output because the carrier amplifier 11 and the peak amplifier 12 operate, and further the signal distortion can be suppressed because the output impedance of the peak amplifier 12 decreases.

Further, in the radio frequency circuit 2 according to the present exemplary embodiment, instead of the quarter-wavelength transmission line, the impedance converting circuit 30 made up of the lines shorter than ¼ of the wavelength is arranged, and thus, it becomes possible to downsize the radio frequency circuit 2.

2.3 Circuit Configuration and Operation of Amplifier Circuit 51 According to Modified Example 1

Figure 6A:
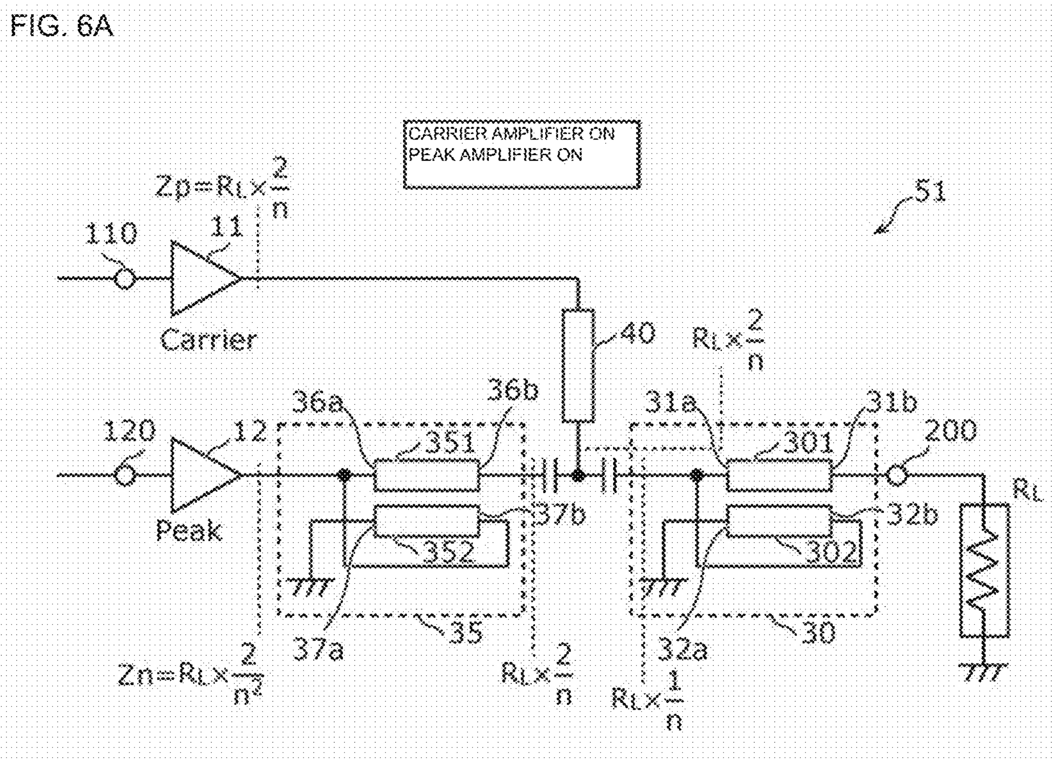
FIG. 6A is a circuit state diagram of an amplifier circuit according to a modified example 1 of the exemplary embodiment 2 at time of receiving a large signal.

Note that instead of the amplifier circuit 50, the radio frequency circuit 2 according to the present exemplary embodiment may include a radio frequency circuit 51 according to a modified example 1. In the following section, the circuit configuration and operation of the amplifier circuit 51 according to the modified Example 1 are described. FIG. 6A is a circuit state diagram of the amplifier circuit 51 according to the modified example 1 of the exemplary embodiment 2 at the time of receiving a large signal. Further, FIG. 6B is a circuit state diagram of the amplifier circuit 51 according to the modified example 1 of the exemplary embodiment 2 at the time of receiving a small signal.

Figure 6B:
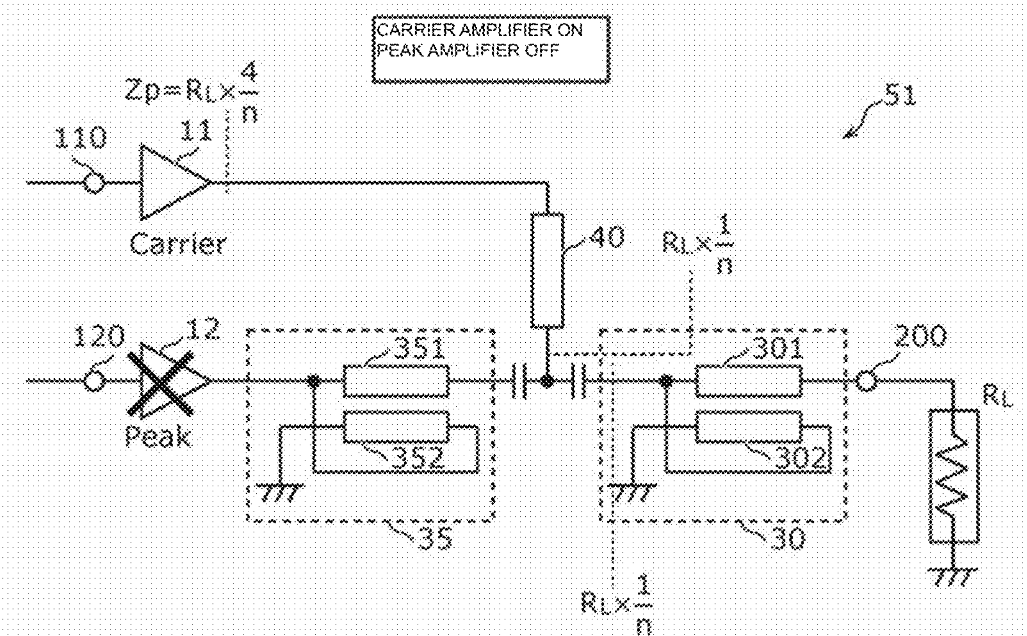
FIG. 6B is a circuit state diagram of the amplifier circuit according to the modified example 1 of the exemplary embodiment 2 at time of receiving a small signal.

As illustrated in FIG. 6A and FIG. 6B, the amplifier circuit 51 according to the modified example 1 includes the carrier amplifier 11, the peak amplifier 12, the quarter-wavelength transmission line 40, the impedance converting circuits 30 and 35, and the signal output terminal 200. Note that although it is not illustrated in the drawings, the amplifier circuit 51 may include the pre-amplifier 15 and the phase shifting circuit 70. The amplifier circuit 51 according to the present modified example is different from the amplifier circuit 50 according to the exemplary embodiment 2 in that the impedance converting circuit 35 is added. In the following section, the amplifier circuit 51 is described with an emphasis on points different from the amplifier circuit 50, and the description regarding the same point as the amplifier circuit 50 is omitted.

The impedance converting circuit 30 is an example of the first circuit and has the main line 301 and the auxiliary line 302. The impedance converting circuit 30 shifts the phase to have different phases at two end ports thereof and further converts the impedance with a predetermined converting ratio. The main line 301 is an example of the first main line and is, for example, a transmission line having a length of 1/16 of the wavelength. The one end portion 31*a* of the main line 301 is connected to the one end portion of the quarter-wavelength transmission line 40, and the other end portion 31*b* of the main line 301 is connected to the signal output terminal 200. The other end portion of the quarter-wavelength transmission line 40 is connected to the output terminal of the carrier amplifier 11. The auxiliary line 302 is an example of the first auxiliary line and is, for example, a transmission line having a length of 1/16 of the wavelength. The one end portion 32*b* of the auxiliary line 302 is connected to the one end portion 31*a* of the main line 301, and the other end portion 32*a* of the auxiliary line 302 is connected to the ground. The first direction directed from the one end portion 31*a* to the other end portion 31*b* of the main line 301 and the second direction directed from the other end portion 32*a* to the one end portion 32*b* of the auxiliary line 302 are the same. With the foregoing configuration, the main line 301 and the auxiliary line 302 are electromagnetically coupled with each other. Note that in the case where the main line 301 and the auxiliary line 302 are seen from an arbitrary direction that is vertical to the extending direction of the main line 301 and the auxiliary line 302, it is preferrable that the foregoing first direction and the foregoing second direction are the same.

The impedance converting circuit 35 is an example of a second circuit and has a main line 351 and an auxiliary line 352. The impedance converting circuit 35 shifts the phase to have different phases at two end ports thereof and further converts the impedance with a predetermined converting ratio. The main line 351 is an example of a second main line and is, for example, a transmission line having a length of 1/16 of the wavelength. One end portion 36*a* of the main line 351 is connected to the output terminal of the peak amplifier 12, and the other end portion 36*b* of the main line 351 is connected to the one end portion of the quarter-wavelength transmission line 40 and the one end portion 31*a* of the main line 301. The auxiliary line 352 is an example of a second auxiliary line and is, for example, a transmission line having a length of 1/16 of the wavelength. One end portion 37*b* of the auxiliary line 352 is connected to the one end portion 36*a* of the main line 351, and the other end portion 37*a* of the auxiliary line 352 is connected to the ground. A third direction directed from the one end portion 36*a* to the other end portion 36*b* of the main line 351 and a fourth direction directed from the other end portion 37*a* to the one end portion 37*b* of the auxiliary line 352 are the same. With the foregoing configuration, the main line 351 and the auxiliary line 352 are electromagnetically coupled with each other. Note that in the case where the main line 351 and the auxiliary line 352 are seen from an arbitrary direction that is vertical to the extending direction of the main line 351 and the auxiliary line 352, it is preferrable that the foregoing third direction and the foregoing fourth direction are the same.

Next, operation of the amplifier circuit 51 according to the present modified example is described.

First, as illustrated in FIG. 6A, when the carrier amplifier 11 and the peak amplifier 12 are in operation (ON) (at the time of receiving a large signal), the output impedance Zp of the carrier amplifier 11 and the output impedance Zn of the peak amplifier 12 are expressed as in Equation 5. Note that the impedance converting circuit 30 converts the impedance in such a way that the impedance of the output port of the impedance converting circuit 30 is 1/n of the impedance of the input port of the impedance converting circuit 30. Further, the impedance converting circuit 35 converts the impedance in such a way that the impedance of the output port of the impedance converting circuit 35 is 1/n of the impedance of the input port of the impedance converting circuit 35. Further, RL is the impedance of a load to be connected to the signal output terminal 200. As described in Equation 5, because of the impedance converting circuits 30 and 35, the output impedance Zn of the peak amplifier 12 becomes 1/n of the output impedance Zp of the carrier amplifier 11.

[Math. 5]

$$Z_p = RL \times \frac{2}{n} \qquad \text{(Equation 5)}$$

$$Z_n = RL \times \frac{2}{n^2}$$

Next, as illustrated in FIG. 6B, when the carrier amplifier 11 is in operation (ON) and the peak amplifier 12 is not in operation (OFF) (at the time of receiving a small signal), the output impedance Zp of the carrier amplifier 11 is expressed as in Equation 6. Note that at this time, the output impedance Zn of the peak amplifier 12 is in the open-circuit state.

[Math. 6]

$$Z_p = RL \times \frac{4}{n} \qquad \text{(Equation 6)}$$

As described in Equation 5 and Equation 6, compared with the time of receiving a large signal, at the time of receiving a small signal, the output impedance Zp of the carrier amplifier 11 increases twofold. That is to say, at the time of receiving a small signal, the peak amplifier 12 turns to the OFF state, and the output impedance Zp of the carrier amplifier 11 increases, and this enables the amplifier circuit 51 to operate with high efficiency.

On the other hand, at the time of receiving a large signal, a high-power signal can be output because the carrier amplifier 11 and the peak amplifier 12 operate. Furthermore, compared with the amplifier circuit 50 according to the exemplary embodiment 2, with the arrangement of the impedance converting circuit 35, the signal distortion can be suppressed because the output impedance Zn of the peak amplifier 12 is low.

Further, in the amplifier circuit 51 according to the present modified example, instead of the quarter-wavelength transmission line, the impedance converting circuits 30 and 35 each made up of the lines shorter than ¼ of the wavelength are arranged, and thus, it becomes possible to downsize the amplifier circuit 51.

2.4 Circuit Configuration and Operation of Amplifier Circuit 52 According to Modified Example 2

Figures 7A, 7B:
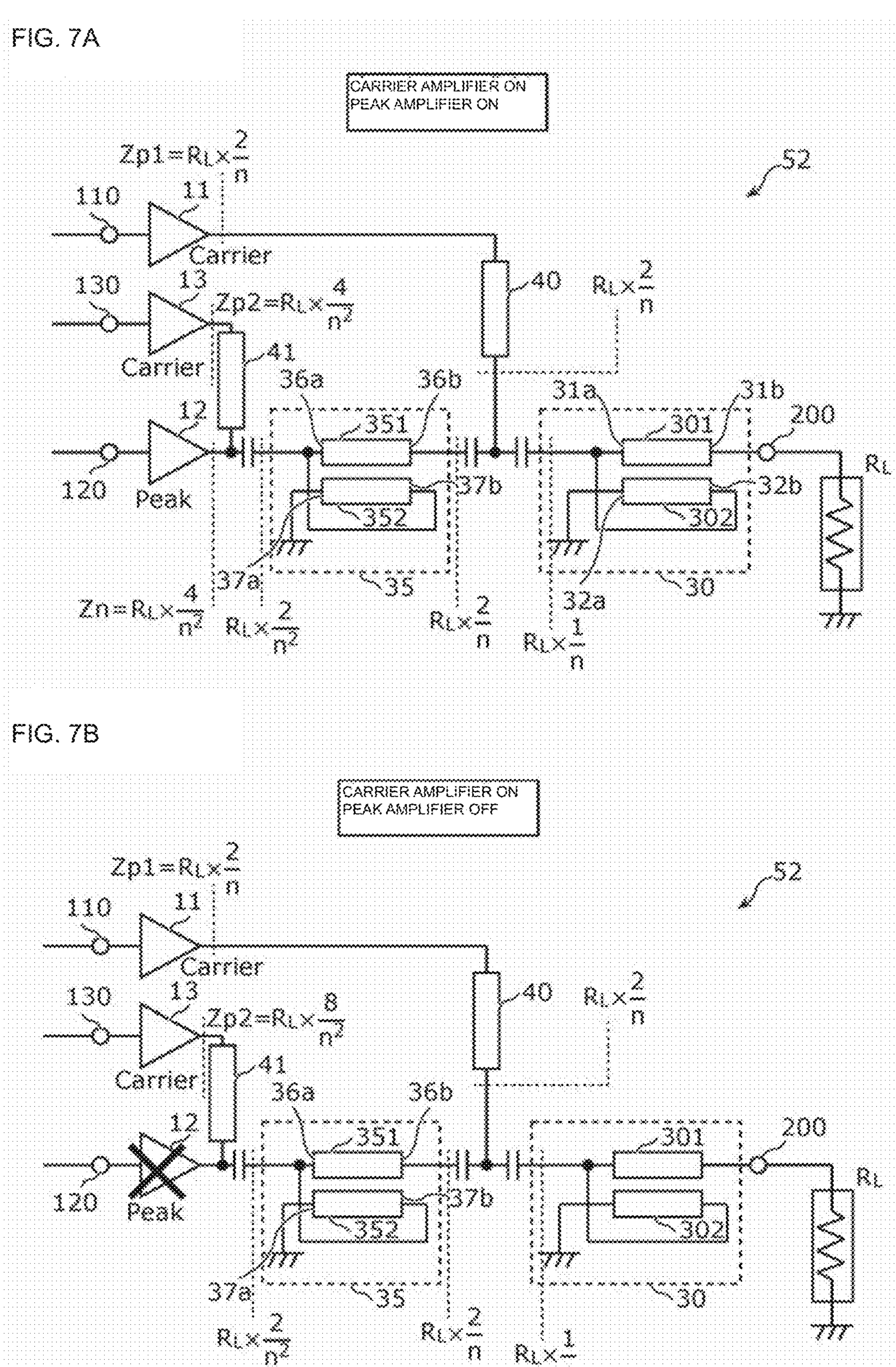
FIG. 7A is a circuit state diagram of an amplifier circuit according to a modified example 2 of the exemplary embodiment 2 at time of receiving a large signal.
FIG. 7B is a circuit state diagram of the amplifier circuit according to the modified example 2 of the exemplary embodiment 2 at time of receiving a medium signal.

Note that instead of the amplifier circuit 50, the radio frequency circuit 2 according to the present exemplary embodiment may include an amplifier circuit 52 according to a modified example 2. In the following section, the circuit configuration and operation of the amplifier Circuit 52 according to the modified example 2 are described. FIG. 7A is a circuit state diagram of the amplifier circuit 52 according to the modified example 2 of the exemplary embodiment 2 at the time of receiving a large signal. Further, FIG. 7B is a circuit state diagram of the amplifier circuit 52 according to the modified example 2 of the exemplary embodiment 2 at the time of receiving a medium signal. Further, FIG. 7C is a circuit state diagram of the amplifier circuit 52 according to the modified example 2 of the exemplary embodiment 2 at the time of receiving a small signal.

Figure 7C:
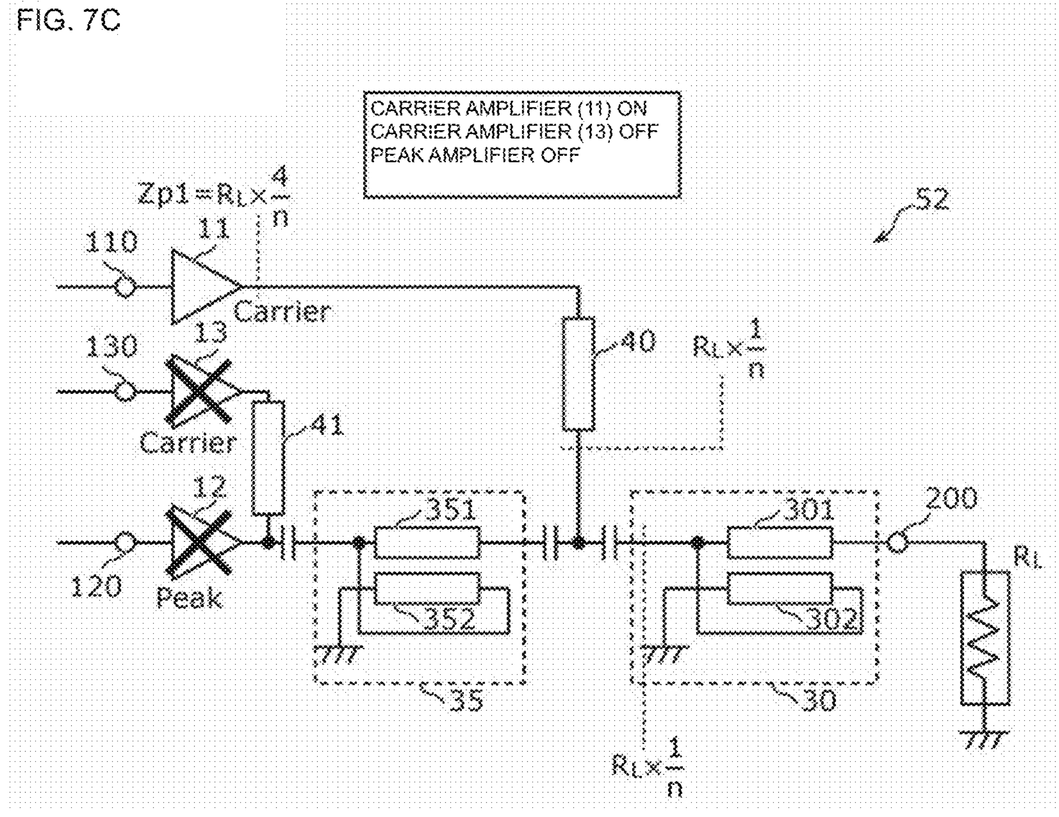
FIG. 7C is a circuit state diagram of the amplifier circuit according to the modified example 2 of the exemplary embodiment 2 at time of receiving a small signal.

As illustrated in FIG. 7A to FIG. 7C, the amplifier circuit 52 according to the modified example 2 includes the carrier amplifier 11, a carrier amplifier 13, the peak amplifier 12, the quarter-wavelength transmission line 40, a quarter-wavelength transmission line 41, the impedance converting circuits 30 and 35, and the signal output terminal 200. Note that although it is not illustrated in the drawings, the amplifier circuit 52 may include the pre-amplifier 15 and the phase shifting circuit 70. The amplifier circuit 52 according to the present modified example is different from the amplifier circuit 51 according to the modified example 1 of the exemplary embodiment 2 only in that the carrier amplifier 13 and the quarter-wavelength transmission line 41 are added. In the following section, the amplifier circuit 52 is described with an emphasis on points different from the amplifier circuit 51, and the description regarding the same point as the amplifier circuit 51 is omitted.

The carrier amplifier 13 is an example of a third amplifying element and is a Class A (or Class AB) amplifier circuit capable of performing amplifying operation in all the power levels of a signal input from a terminal 130. Particularly, the carrier amplifier 13 can perform a highly efficient amplifying operation in the middle output range.

The quarter-wavelength transmission line 41 is an example of a second transmission line. One end portion of the quarter-wavelength transmission line 41 is connected to an output terminal of the carrier amplifier 13, and the other end portion of the quarter-wavelength transmission line 41 is connected to the output terminal of the peak amplifier 12 and the one end portion 36*a* of the main line 351. The quarter-wavelength transmission line 41 shifts the phase of the signal output from the carrier amplifier 13 by −90 degrees (delays 90 degrees). With the arrangement of the quarter-wavelength transmission line 41, the phase of the signal output from the carrier amplifier 13 and the phase of the signal output from the peak amplifier 12 are set in the same phase. Because of this, the signal output from the carrier amplifier 13 and the signal output from the peak amplifier 12 are combined in current.

Next, operation of the amplifier circuit 52 according to the present modified example is described.

First, as illustrated in FIG. 7A, when the carrier amplifiers 11 and 13 and the peak amplifier 12 are in operation (ON) (at the time of receiving a large signal), an output impedance Zp1 of the carrier amplifier 11, an output impedance Zp2 of the carrier amplifier 13, and the output impedance Zn of the peak amplifier 12 are expressed as in Equation 7. As described in Equation 7, because of the impedance converting circuits 30 and 35, the output impedance Zn of the peak amplifier 12 becomes 2/n of the output impedance Zp1 of the carrier amplifier 11.

[Math. 7]

$$Z_p1 = RL \times \frac{2}{n} \quad \text{(Equation 7)}$$

$$Z_p2 = RL \times \frac{4}{n^2}$$

$$Z_n = RL \times \frac{4}{n^2}$$

Next, as illustrated in FIG. 7B, when the carrier amplifiers 11 and 13 are in operation (ON) and the peak amplifier 12 is not in operation (OFF) (at the time of receiving a medium signal), the output impedance Zp1 of the carrier amplifier 11 and the output impedance Zp2 of the carrier amplifier 13 are expressed as in Equation 8. Note that at this time, the output impedance Zn of the peak amplifier 12 is in the open-circuit state. As described in Equation 8, because of the impedance converting circuit 35, the output impedance Zp2 of the carrier amplifier 13 increases twofold compared with the output impedance Zp2 of the carrier amplifier 13 at the time of receiving a large signal.

[Math. 8]

$$Z_p1 = RL \times \frac{2}{n} \quad \text{(Equation 8)}$$

$$Z_p2 = RL \times \frac{8}{n^2}$$

Next, as illustrated in FIG. 7C, when the carrier amplifier 11 is in operation (ON) and the carrier amplifier 13 and the peak amplifier 12 are not in operation (OFF) (at the time of receiving a small signal), the output impedance Zp1 of the carrier amplifier 11 is expressed as in Equation 9. Note that at this time, the output impedances of the carrier amplifier 13 and the peak amplifier 12 are in the open-circuit state.

[Math. 9]

$$Z_p1 = RL \times \frac{4}{n} \quad \text{(Equation 9)}$$

As described in Equation 9, compared with the time of receiving a medium signal, at the time of receiving a small signal, the output impedance Zp1 of the carrier amplifier 11 increases twofold. That is to say, at the time of receiving a small signal, the carrier amplifier 13 and the peak amplifier 12 turn to the OFF state, and the output impedance Zp1 of the carrier amplifier 11 increases, and this enables the amplifier circuit 52 to operate with high efficiency.

On the other hand, at the time of receiving a large signal, a high-power signal can be output because the carrier amplifiers 11 and 13 and the peak amplifier 12 operate, and further the signal distortion can be suppressed because the output impedance Zn of the peak amplifier 12 is low.

With the foregoing configuration of the amplifier circuit 52, the output impedance Zp1 of the carrier amplifier 11 increases as the state transitions from the time of receiving a large signal to the time of receiving a medium signal to the time of receiving a small signal.

That is to say, compared with the amplifier circuit 51 according to the modified example 1, with the amplifier circuit 52 according to the present modified example, it becomes possible to finely set the output impedances of the carrier amplifiers 11 and 13 depending on whether the state is the time of receiving a large signal, the time of receiving a medium signal, or the time of receiving a small signal. Thus, it becomes possible to improve the efficiency with a high degree of accuracy.

2.5 Component Layout Configuration of Radio Frequency Circuit 2

Next, a component layout configuration of the radio frequency circuit 2 according to the exemplary embodiment 2 is described.

Figure 8:
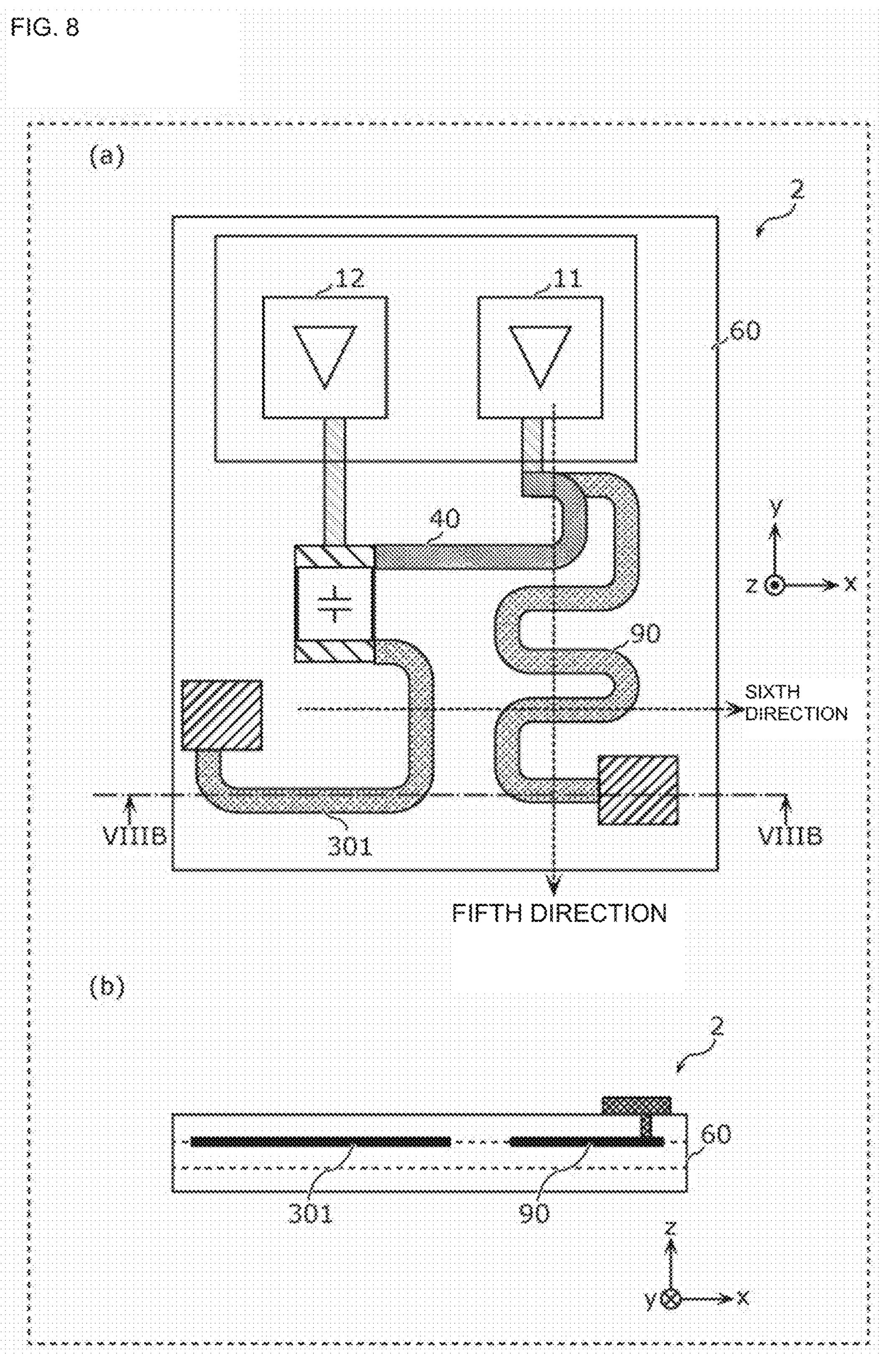
FIG. 8 illustrates a plan view and a cross-sectional view of the radio frequency circuit according to the exemplary embodiment 2.

FIG. 8 illustrates a plan view and a cross-sectional view of the radio frequency circuit 2 according to the exemplary embodiment 2. FIG. 8 (*a*) illustrates a transparent view of layout of circuit components when a principal surface of a board 60 is seen from the z-axis positive direction side, and FIG. 8 (*b*) illustrates a cross-sectional view at VIIIB-VIIIB line in FIG. 8 (*a*). Further, in FIG. 8 (*a*), for facilitating the understanding of spatial relationships between the respective circuit components, marks representing their functions are attached to the respective circuit components in some cases. However, such a mark is not attached to each actual circuit component. Further, in FIG. 8, wiring lines connecting the board 60 and respective circuit components are not illustrated.

Note that the radio frequency circuit 2 may further include a resin member that covers part of the surface of the board 60 and the circuit components and a shield electrode layer that covers the resin member. In FIG. 8, the resin member and the shield electrode layer are not illustrated.

In addition to the circuit configuration illustrated in FIG. 5, the radio frequency circuit 2 further has the board 60 and a power line 90.

The board 60 is a board on which circuit components that make up the radio frequency circuit 2 are mounted. As the board 60, for example, a Low Temperature Co-fired Ceramics (LTCC) board, a High Temperature Co-fired Ceramics (HTCC) board, a board including components, a board having a Redistribution Layer (RDL), a printed board, or the like, each of which has a multilayer structure including a plurality of dielectric layers, may be used.

On the surface of the board 60, the carrier amplifier 11, the peak amplifier 12, a capacitive element, and the like are arranged.

The carrier amplifiers 11 and 13 are included in a semiconductor IC. The semiconductor IC is arranged on the board 60. The semiconductor IC may be configured using, for example, a CMOS (Complementary Metal Oxide Semiconductor) and more specifically, may be fabricated using SOI (Silicon on Insulator) processing. Further, the semiconductor IC may be composed of at least one of GaAs, SiGe, and GaN. Note that the semiconductor material of the semiconductor IC is not limited to the materials described above.

Note that semiconductor IC may include at least one of pre-amplifier 15, the phase shifting circuit 70, and the switches 81 and 84.

The main line 301 and the auxiliary line 302 (not illustrated) of the impedance converting circuit 30 is formed on the surface of or in the inside of the board 60. The main line 301 and the auxiliary line 302 are made up of planar conductors formed on the surface of or in the inside of the board 60. The main line 301 and the auxiliary line 302 may be formed in the same layer or in different layers of the board 60. Further, each of the main line 301 and the auxiliary line 302 may be formed across a plurality of layers.

The power line 90 is connected to the carrier amplifier 11 and the peak amplifier 12 and is a wiring line for supplying power voltages to the carrier amplifier 11 and the peak amplifier 12. The power line 90 is formed on the surface of or in the inside of the board 60. The power line 90 is made up of a planar conductor formed on the surface of or in the inside of the board 60.

Here, when the board 60 is seen in a planar view, the main line 301 and the auxiliary line 302 are arranged on the surface of or in the inside of the board 60 in a fifth direction (y-axis direction of FIG. 8) of the peak amplifier 12. On the other hand, the power line 90 is arranged on the surface of or in the inside of the board 60 in an intersecting part of the fifth direction (y-axis direction of FIG. 8) of the carrier amplifier 11 and a sixth direction (x-axis direction of FIG. 8), which is orthogonal to the fifth direction, of the main line 301 and the auxiliary line 302.

According to this, the distances between the main line 301 and the peak amplifier 12 and between the auxiliary line 302 and the peak amplifier 12 can be shortened, and furthermore, the power line 90 can be arranged by effectively using space in the foregoing intersecting part. Accordingly, it becomes possible to downsize the radio frequency circuit 2 while reducing the transmission loss of the radio frequency circuit 2.

2.6 Exemplary Advantageous Effects and the Like

As described above, the radio frequency circuit 2 according to the present exemplary embodiment includes the carrier amplifier 11 and the peak amplifier 12, the quarter-wavelength transmission line 40, the signal output terminal 200, and the impedance converting circuit 30, wherein the quarter-wavelength transmission line 40 is connected between the output terminal of the carrier amplifier 11 and the output terminal of the peak amplifier 12, the impedance converting circuit 30 has the main line 301 and the auxiliary line 302, the one end portion 31*a* of the main line 301 is connected to the one end portion of the quarter-wavelength transmission line 40, and the other end portion 31*b* of the main line 301 is connected to the signal output terminal 200, the other end portion of the quarter-wavelength transmission line 40 is connected to the output terminal of the carrier amplifier 11, the one end portion 32*b* of the auxiliary line 302 is connected to the one end portion 31*a* of the main line 301, and the other end portion 32*a* of the auxiliary line 302 is connected to the ground, and the first direction directed from the one end portion 31*a* to the other end portion 31*b* of the main line 301 and the second direction directed from the other end portion 32*a* to the one end portion 32*b* of the auxiliary line 302 are the same.

According to this, instead of the quarter-wavelength transmission line, the impedance converting circuit 30 made up of the lines shorter than ¼ of the wavelength are arranged, and thus, it becomes possible to downsize the radio frequency circuit 2.

Further, for example, the radio frequency circuit 2 may further include the impedance converting circuit 35, wherein the impedance converting circuit 35 may have the main line 351 and the auxiliary line 352, the one end portion 36*a* of the main line 351 may be connected to the output terminal of the peak amplifier 12, and the other end portion of the main line 351 may be connected to the one end portion of the quarter-wavelength transmission line 40 and the one end portion 31*a* of the main line 301, the one end portion 37*b* of the auxiliary line 352 may be connected to the one end portion 36*a* of the main line 351, and the other end portion of the auxiliary line 352 may be connected to the ground, and the third direction directed from the one end portion 36*a* to the other end portion 36*b* of the main line 351 and the fourth direction directed from the other end portion 37*a* to the one end portion 37*b* of the auxiliary line 352 may be the same.

According to this, instead of the quarter-wavelength transmission line, the impedance converting circuits 30 and 35 each made up of the lines shorter than ¼ of the wavelength are arranged, and thus, it becomes possible to downsize the radio frequency circuit 2. Further, because the output impedance of the peak amplifier 12 can be reduced, the signal distortion can be reduced in the high output range.

Further, for example, the radio frequency circuit 2 may further include the carrier amplifier 13 and the quarter-wavelength transmission line 41, wherein the one end portion of the quarter-wavelength transmission line 41 may be connected to the output terminal of the carrier amplifier 13, and the other end portion of the quarter-wavelength transmission line 41 may be connected to the output terminal of the peak amplifier 12 and the one end portion 36*a* of the main line 351.

According to this, the output impedance of the carrier amplifier 13 can be increased in the low output range and the middle output range, and this facilitates high efficiency.

Further, for example, the radio frequency circuit 2 may further include the board 60 and the power line 90 that is connected to the carrier amplifier 11 and the peak amplifier 12 and supplies the power voltages to the carrier amplifier 11 and the peak amplifier 12, wherein the carrier amplifier 11 and the peak amplifier 12 may be arranged on or inside the board 60, and when the board 60 is seen in a planar view, the main line 301 and the auxiliary line 302 may be arranged on the surface of or in the inside of the board 60 in the fifth direction of the peak amplifier 12, and the power line 90 may be arranged on the surface of or in the inside of the board 60 in an intersecting part of the fifth direction of the carrier amplifier 11 and the sixth direction, which is orthogonal to the fifth direction, of the main line 301 and the auxiliary line 302.

According to this, the distances between the main line 301 and the peak amplifier 12 and between the auxiliary line 302 and the peak amplifier 12 can be shortened, and furthermore, the power line 90 can be arranged by effectively using space in the foregoing intersecting part. Accordingly, it becomes possible to downsize the radio frequency circuit 2 while reducing the transmission loss of the radio frequency circuit 2.

Further, for example, in the radio frequency circuit 2, the carrier amplifier 11 and the peak amplifier 12 are included in the semiconductor IC, and this semiconductor IC may be arranged on the board 60.

According to this, it becomes possible to downsize the radio frequency circuit 2.

Further, the communication device 9 according to the present exemplary embodiment includes the RFIC 7 that performs processing on a radio frequency signal and the radio frequency circuit 2 that transmits a radio frequency signal between the RFIC 7 and the antenna 6.

According to this, it becomes possible to realize the exemplary advantageous effects of the radio frequency circuit 2 in the communication device 9.

OTHER EMBODIMENTS AND THE LIKE

The radio frequency circuits and the communication devices according to the exemplary embodiments of the present disclosure have been described using the exemplary embodiment and the modified examples. However, the radio frequency circuit and the communication device according to the present disclosure are not limited to the foregoing exemplary embodiments and modified examples. Other exemplary embodiments realized by combining optional constituent elements of the foregoing exemplary embodiment and modified examples, modified examples obtained by applying various modifications conceivable to those skilled in the art to the foregoing exemplary embodiments and modified examples without departing the scope of the present disclosure, and various devices incorporating the foregoing radio frequency circuits and communication devices may also be included in the present disclosure.

For example, in the radio frequency circuits and the communication devices according to the foregoing exemplary embodiments and the modified examples thereof, another circuit element, a wiring line, or the like may be inserted in a path connecting each circuit element and a signal path disclosed in the drawing.

INDUSTRIAL APPLICABILITY

The present invention can be widely used in communication devices such as mobile phones and the like as a radio frequency circuit to be arranged in a multiband front-end unit.

REFERENCE SIGNS LIST

1, 2 Radio frequency circuit
6 Antenna
7 RF signal processing circuit (RFIC)
8, 9 Communication device
10, 50, 51, 52, 500 Amplifier circuit
11, 13 Carrier amplifier
12 Peak amplifier
15 Pre-amplifier
20 Transformer
30, 35 Impedance converting circuit
31*a*, 32*b*, 36*a*, 37*b* One end portion
31*b*, 32*a*, 36*b*, 37*a* Other end portion
40, 41, 530 Quarter-wavelength transmission line
60 Board
70 Phase shifting circuit
81, 84 Switch
82, 83 Filter
90 Power Line
101 Input terminal
102 Antenna connection terminal
110, 120, 130 Terminal
200 Signal output terminal
201 Input side coil
202 Output side coil
301, 351 Main line
302, 352 Auxiliary line

The invention claimed is:

1. A radio frequency circuit comprising:
a first amplifying element and a second amplifying element;
a first transmission line;
a signal output terminal; and
a first circuit, wherein
the first transmission line is connected between an output terminal of the first amplifying element and an output terminal of the second amplifying element,
the first circuit includes
a first main line, and
a first auxiliary line,
one end portion of the first main line is connected to one end portion of the first transmission line, and another end portion of the first main line is connected to the signal output terminal,
another end portion of the first transmission line is connected to the output terminal of the first amplifying element,
one end portion of the first auxiliary line is connected to the one end portion of the first main line, and another end portion of the first auxiliary line is connected to ground, and
a first direction directed from the one end portion of the first main line to the another end portion of the first main line and a second direction directed from the another end portion of the first auxiliary line to the one end portion of the first auxiliary line are the same,
wherein the radio frequency circuit further comprises:
a board; and
a power line connected to the first amplifying element and the second amplifying element, the power line being configured to supply power voltages to the first amplifying element and the second amplifying element, wherein
the first amplifying element and the second amplifying element are arranged on or inside the board, and
when the board is seen in a planar view,
the first main line and the first auxiliary line are arranged on a surface of or in an inside of the board in a fifth direction of the second amplifying element, and
the power line is arranged on a surface of or in an inside of the board in an intersecting part of the fifth direction of the first amplifying element and a sixth direction of the first main line and the first auxiliary line, the sixth direction being orthogonal to the fifth direction.

2. The radio frequency circuit according to claim 1, further comprising:
a second circuit, wherein
the second circuit includes
a second main line, and
a second auxiliary line,
one end portion of the second main line is connected to the output terminal of the second amplifying element, and another end portion of the second main line is connected to the one end portion of the first transmission line and the one end portion of the first main line,
one end portion of the second auxiliary line is connected to the one end portion of the second main line, and another end portion of the second auxiliary line is connected to the ground, and
a third direction directed from the one end portion of the second main line to the another end portion of the second main line and a fourth direction directed from the another end portion of the second auxiliary line to the one end portion of the second auxiliary line are the same.

3. The radio frequency circuit according to claim 2, further comprising:

a third amplifying element; and a second transmission line, wherein one end portion of the second transmission line is connected to an output terminal of the third amplifying element, and another end portion of the second transmission line is connected to the output terminal of the second amplifying element and the one end portion of the second main line.

4. The radio frequency circuit according to claim 2, wherein the first amplifying element and the second amplifying element are included in a semiconductor IC, and the semiconductor IC is arranged on the board.

5. The radio frequency circuit according to claim 4, wherein the semiconductor IC includes a complementary metal oxide semiconductor (CMOS) IC.

6. The radio frequency circuit according to claim 4, wherein the CMOS IC is a silicon on insulator (SOI) IC.

7. The radio frequency circuit according to claim 4, wherein the semiconductor IC includes at least one of GaAs, SiGe, and GaN.

8. The radio frequency circuit of claim 2, wherein the board includes a low temperature co-fired ceramics (LTCC) board or a high temperature co-fired ceramics (HTCC) board.

9. The radio frequency circuit of claim 2, wherein the board includes a multilayer structure including a plurality of dielectric layers.

10. The radio frequency circuit of claim 2, wherein the board includes a redistribution layer.

11. The radio frequency circuit according to claim 1, wherein the first amplifying element and the second amplifying element include at least one of a bipolar transistor and a metal oxide semiconductor field effect transistor (MOSFET).

12. The radio frequency circuit according to claim 1, wherein at least one of the first amplifying element and the second amplifying element includes a Class A amplifier.

13. The radio frequency circuit according to claim 1, wherein at least one of the first amplifying element and the second amplifying element includes a Class AB amplifier.

* * * * *